United States Patent [19]

Unruh

[11] Patent Number: 5,350,594

[45] Date of Patent: Sep. 27, 1994

[54] CONFORMALLY COATED FARADAY CAGE

[75] Inventor: Greg R. Unruh, Amarillo, Tex.

[73] Assignee: Tech Spray, Inc., Amarillo, Tex.

[21] Appl. No.: 8,202

[22] Filed: Jan. 25, 1993

[51] Int. Cl.[5] .................... C23C 26/00; B05D 1/00
[52] U.S. Cl. ............................. 427/96; 427/410;
      427/419.5; 427/421; 427/429; 427/430.1
[58] Field of Search ........... 427/96, 421, 429, 430.1,
      427/410, 419.5

[56] References Cited

U.S. PATENT DOCUMENTS

| | | | |
|---|---|---|---|
| 3,504,828 | 4/1970 | Stephenson | 222/402.24 |
| 3,693,252 | 9/1972 | Robertson et al. | 29/627 |
| 4,063,349 | 12/1977 | Passler et al. | 29/627 |
| 4,100,675 | 7/1978 | Landsittel | 29/627 |
| 4,143,456 | 3/1979 | Inoue | 29/588 |
| 4,230,385 | 10/1980 | Ammon et al. | 339/17 |
| 4,238,528 | 12/1980 | Angelo et al. | 427/96 |
| 4,290,052 | 9/1981 | Eichelberger et al. | 340/365 |
| 4,300,184 | 11/1981 | Colla | 361/397 |
| 4,477,517 | 10/1984 | Rummel | 427/421 |
| 4,528,748 | 7/1985 | Eichelberger et al. | 29/835 |
| 4,815,981 | 3/1989 | Mizuno | 439/77 |
| 4,871,316 | 10/1989 | Herrell et al. | 439/66 |
| 5,043,184 | 8/1991 | Fujii | 427/96 |
| 5,114,756 | 5/1992 | Mirabeau | 427/410 |

OTHER PUBLICATIONS

"Evaluation Semi–Rigid Plastic Trays" From EOS-/ESD Technology Magazine –Apr./May 1992 Authors: A. E. Warnecke and Cecil W. Deisch.

"Zelec ECP –Electroconductive Powders" (Du Pont Specification Sheets).

*Primary Examiner*—Shrive Beck
*Assistant Examiner*—Vi Duong Dang
*Attorney, Agent, or Firm*—Hubbard, Tucker & Harris

[57] ABSTRACT

In one form of the invention, an electronic device having a conformally coated Faraday cage, comprising a non-conductive conformal layer (30) substantially coveting the electronic device (10, 12) and a conductive conformal layer (34) substantially coveting the non-conductive conformal layer.

11 Claims, 1 Drawing Sheet

CONFORMALLY COATED FARADAY CAGE

TECHNICAL FIELD OF THE INVENTION

The present invention relates to a Faraday cage and more particularly to a conformally coated Faraday cage for use with electronic components.

BACKGROUND OF THE INVENTION

In the electronics industry, manufacturers are constantly designing and building smaller, faster components in order to gain improvements in circuit performance and cost. The smaller these components become, the more susceptible they will be to damage from static electricity. Electrostatic discharge (or ESD) is a phenomenon which destroys components and costs manufacturers millions of dollars each year. Many attempts have been made to control ESD in the prior art, but all of them have been only marginally successful.

To fully understand the significance of the problem, it is necessary to understand the mechanism by which electrostatic discharge occurs and the various prior art methods that have attempted to control it. The prior art solutions have basically attempted to cope with ESD by packaging sensitive electronic components and circuits in various forms of containers, a typical example of which is shown in FIG. 1. Circuit board 10 containing ESD sensitive components 12 is completely encased within packaging material 14 which rests upon grounded or static dissipative surface 16. As body 18 reaches to touch the package 14, a spark discharge 20 to the package can occur. This happens because as the charged body 18 approaches the surface of the package 14, a thin column of air becomes ionized and a spark discharge 20 is initiated. This thin column of highly conductive ionized gas forms exceedingly fast (in a nanosecond or less) and, once formed, it behaves electrically very much like an ordinary small diameter wire. In other words, almost all of the voltage across it is inductive voltage ($V = L\, di/dt$). Very quickly, electric charge flows through this ionized column and is deposited in a small area on the surface of the package 14. However, as the charge accumulates on this surface spot, the voltage of the spot rapidly rises and approaches that of the charged body 18.

Once the voltage difference between the surface spot and the body 18 gets small enough (about several hundred volts), the ionized column can no longer support itself and it extinguishes. This whole sequence of events, from initiation to quenching, happens very quickly (approximately a few nanoseconds). The main parameter that limits the speed is the inductance L of the thin column of ionized gas.

What happens on the surface of the package 14 during this short event is strongly dependent on the surface resistivity of the package 14. For a material with a relatively high surface resistivity ($10^{11}$ Ohms/square), there are many tiny, faint sparks 20 during a discharge. For each tiny discharge, the point on the surface directly beneath the spark 20 has a very high voltage; however, the voltage just a short distance away may be many hundreds of volts less during the actual spark discharge 20. This is because the high surface resistivity slows down the diffusion of the spark-deposited charge. The point where the spark 20 makes contact with the package 14 rises to several thousand volts, but just a short distance away (e.g. one inch) the voltage may be in the low hundreds or less.

Once the spark 20 extinguishes, the concentrated charge on the surface quickly spreads out through surface conduction and the voltage peak quickly decays. These events are quite analogous to dropping a pebble into a pool of water. A column of water of substantial height forms fight at the center, but the height of the rest of the water quickly drops off as the radius increases. As time passes, the height of the center column and the water immediately around it are quickly restored to the average surface height of the pool (which is now imperceptibly greater due to the volume displaced by the pebble).

Packages with lower surface resistivity can have fatter and more aggressive spark discharges 20 to the surface of package 14; but lower resistivity actually improves ESD protection. Since any discharge 20 to the surface of the package 14 has to charge a larger area, more charge must flow for a longer time to attain the same surface voltage which is developed on the lower resistivity package 14. The longer it takes to charge up this larger area, the more time is available for the charge to bleed away from body 18. The greater the amount of charge removed from the body 18 during the spark 20, the more the voltage of body 18 is reduced. The net result is that, although a larger area of the package rises in voltage, the peak voltage at any point on the surface is less.

There have been three types of packaging 14 developed in the prior art to prevent damage to the electronic components inside the packaging 14 caused by ESD spark discharges. They are metal, insulative and static-dissipative.

Metal packages have been constructed which give near-perfect ESD and electrical overstress (EOS) protection. This is because there is virtually no resistive voltage drop anywhere on the surface of the package 14 and the charge on body 18 is shunted to grounded surface 16, dissipating the voltage potential between body 18 and the contents of the package 14. Furthermore, no flux lines can penetrate the metal at the high frequencies of a spark discharge, so there can be no induced voltage between any two points on the inside of the package (where the sensitive components 12 reside). If there is no voltage differential anywhere inside the package 14, then there can be no harmful voltages to damage the sensitive components 12. While metal packages 14 are the most effective, they are generally impractical because of their expense and weight.

A package 14 made of insulative material (e.g. untreated polyethylene) also gives excellent protection to the enclosed circuit board 10, but only as long as the package 14 remains closed. A charged body 18 which touches the package will not generate a spark 20 because the insulative material will not conduct. Further, polyethylene can sustain several kilovolts per rail of thickness, so there is no potential for breakdown from the outside surface of package 14 to the inside surface. However, a charged person who picks up the package 14 will remain fully charged because the package 14 is not able to shunt any charge to the grounded surface 16 when body 18 touches it. If the package 14 is then opened and body 18 touches circuit board 10, there will be a spark discharge, possibly harming the components 12.

The ESD protection offered by a package 14 made from static dissipative material falls somewhere between the metal and insulative packages discussed hereinabove. A charged body 18 can discharge a spark 20 to static dissipative material. However, even though its surface resistivity ($10^5$ to $10^{11}$ Ohms/square) is not nearly as low as metal, a properly designed static dissipative package 14 can quickly bleed away the charge on body 18, thereby lessening the chance of subsequent ESD damage.

The problem which these and all other prior art ESD protection schemes have in common is that the sensitive components 12 are only protected so long as they remain in the package 14. However, the circuit board 10 must be removed from the package 14 many times during the manufacturing and testing process, and more importantly, the end user must remove it from the package 14 for installation and then discard the package 14. At this point, there is no longer any protection for the components 12 from ESD.

SUMMARY OF THE INVENTION

It is therefore the object of the present invention to provide an ESD protection scheme for static sensitive components and circuits boards which overcomes the problems inherent in the prior art. Specifically, it is the object of the present invention to provide an ESD protection scheme which will protect static sensitive components and circuit boards from EOS damage throughout the testing, shipping, storage and end use life cycle of the circuit boards.

In one form of the invention, an electronic device having a conformally coated Faraday cage is disclosed, comprising a non-conductive conformal layer substantially coveting the electronic device and a conductive conformal layer substantially coveting the non-conductive conformal layer.

In another form of the invention, a conductive conformal coating material is disclosed, comprising a binding agent selected from the group consisting of acrylic resins, epoxy resins, silicone resins, urethane resins, and paraxylene; and a conductive additive mixed with the binding agent.

In another form of the invention, a method of coating an electronic device is disclosed, comprising the steps of: (a) applying a non-conductive conformal layer substantially covering the electronic device and (b) applying a conductive conformal layer substantially covering the non-conductive conformal layer.

Finally, in another form of the invention, a method of grounding an electronic circuit board is disclosed, comprising the steps of (a) applying a non-conductive conformal layer substantially covering the electronic circuit board; (b) applying a conductive conformal layer substantially coveting the non-conductive conformal layer; (c) making electrical contact between the conductive conformal layer and a ground plane of the electronic circuit board and (d) operatively coupling the ground plane to a ground potential.

BRIEF DESCRIPTION OF THE DRAWINGS

For a more complete understanding of the present invention, and for further details and advantages thereof, reference is now made to the following Detailed Description taken in conjunction with the accompanying drawings, in which.

DETAILED DESCRIPTION OF THE DRAWINGS

Figure 1:
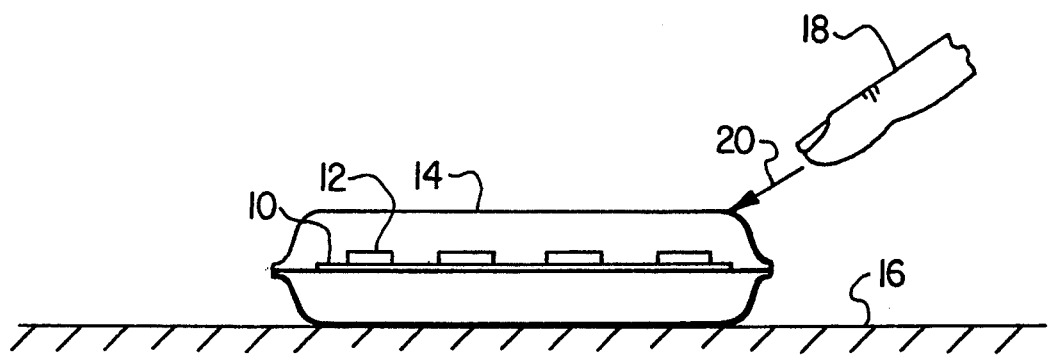
FIG. 1 is a cross sectional view of a prior art ESD protective package encasing a circuit board.
Figure 2:
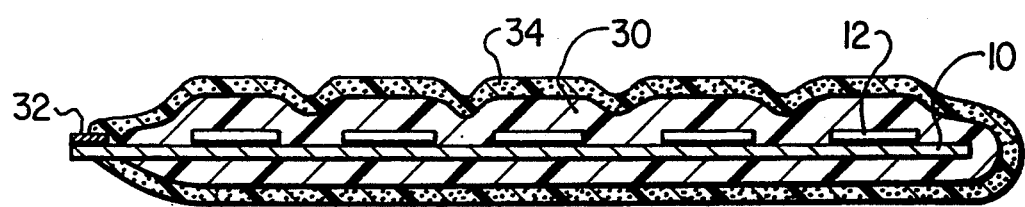
FIG. 2 is a cross sectional view of a first embodiment of the present invention encasing a circuit board.

Referring to FIG. 2, there is shown a cross sectional view of a first embodiment of the present invention. Relative dimensions in the drawings have been exaggerated for clarity of illustration. A circuit board 10, containing at least one static sensitive component 12 mounted thereon, is first conformally coated with a non-conductive layer 30 over its entire top, bottom and side surfaces with the exception of contact 32 and other circuit board 10 contacts (not shown). Contact 32 connects to the ground plane of the circuit board 10. Ground plane contact 32 and the other circuit board 10 contacts (not shown), which connect to various components 12 for transmission of information-bearing signals or power supply signals, are protected during the first conformal coating operation by a temporary mask (not shown) as is known in the art. Circuit board 10 may be, for example, a printed wiring board, a copper-clad duroid substrate or a ceramic substrate. The first conformal coat layer 30 is then cured. The preferred curing methods for the various coating types will be discussed in detail hereinbelow. Next, a second conformal coat layer 34, which is conductive and preferably has a surface resistivity of $10^6$ to $10^9$ Ohms/square, is applied so that it also completely covers the entire top, bottom and side surfaces of circuit board 10 and components 12. The other circuit board 10 contacts (not shown) are protected during the second conformal coating operation by a temporary mask (not shown) as is known in the art. Conformal coat layer 34 additionally makes contact with ground plane contact 32. The second conformal coat layer 34 is then cured as will be discussed in more detail hereinbelow. The first, non-conductive conformal layer 30 prevents the second, conductive conformal layer 34 from making contact with any leads of the components 12 or traces of the circuit board 10.

The combination of the non-conductive layer 30 underlying the conductive layer 34 provides excellent ESD protection for the static sensitive components 12 for the same reasons that the prior art conductive packaging 14 does. However, unlike the prior art, the ESD protection of the present invention remains in effect throughout the entire life cycle of the circuit board 10. When the circuit board 10 is installed (such as on a computer motherboard) and the ground plane contact 32 is coupled to the system ground, all of the static sensitive components 12 are enclosed in an ESD protective Faraday cage formed by the conductive conformal layer 34 and its connection to ground through contact 32.

In the preferred embodiment of the present invention, the non-conductive coating 30 may be formed from any one of five general classes of coatings, which are tabulated in Table 1 together with their military specification numbers.

TABLE 1

| | Coating Classifications | |
|---|---|---|
| TYPE | MIL-SPEC NUMBER | DESCRIPTION |
| AR | MIL-I-46058C Type AR | Acrylic Resin |
| ER | MIL-I-46058C Type ER | Epoxy Resin |
| SR | MIL-I-46058C Type SR | Silicone Resin |
| UR | MIL-I-46058C Type UR | Urethane Resin |
| XY | N/A | Paraxylene |

There are four basic methods that the non-conductive conformal layer 30 and the conductive conformal layer 34 may be applied to the circuit board 10. First, the circuit board 10 may be dip-coated. With this method, all of the areas which are to be covered by conformal layer 30 are immersed into a container of the coating material in substantially liquid form. This method is very effective for insuring that every portion of the circuit board 10 and components 12 are coated. Alternatively, the circuit board 10 may be brush coated. With this method, a brush is immersed into the substantially liquid conformal coating material and then stroked across the surface of circuit board 10 and components 12 until all desired surfaces are coated. It is hardest to create a layer 30 having a uniform thickness when using this method. Lastly, the circuit board 10 may be spray coated (non-aerosol) or aerosol spray coated. With both spray methods, a fine spray of the coating material is passed across the surface of the circuit board 10 and components 12 using a non-aerosol or aerosol delivery method as is known in the art. These methods can effectively create a uniform, controlled conformal layer 30. There exist in the art other, more specialized methods for applying conformal coating, and the present invention comprehends the use of any method which is suited to the application of the particular conformal material used.

To insure proper adhesion of the conductive layer 34 to the non-conductive layer 30 (in order to prevent later delamination), it is preferable that the conductive coating 34 have the same binding agent as the insulating, non-conductive coating 30. Thus, a silicone resin conformal coating 30 should be followed by a conductive conformal coat 34 which has a silicone resin base. It is therefore preferable that the conductive conformal coating material 34 be made by incorporating a conductive additive into the insulating conformal coat material used for layer 30. In a preferred embodiment of the present invention, an Antimony doped Tin Oxide conductive pigment is added to the insulating conformal coating material 30 in sufficient quantities to make it conductive (see exemplary product numbers in Table II; these products are manufactured by the DuPont Corp. under the trademark name ZELEC).

TABLE II

| Conductive Additives | | |
|---|---|---|
| PRODUCT NUMBER | MANUFACTURER | DESCRIPTION |
| ZELEC ECP 1610-S | DuPont | Silica shell core |
| ZELEC ECP 2610-S | DuPont | Silica shell core |
| ZELEC ECP 3610-S | DuPont | Silica shell core |
| ZELEC ECP 1410-M | DuPont | Mica core |
| ZELEC ECP 1410-T | DuPont | TiO$_2$ core |
| ZELEC ECP 3410-T | DuPont | TiO$_2$ core |
| ZELEC ECP 1703-S | DuPont | Silica shell core |
| ZELEC ECP 2703-S | DuPont | Silica shell core |
| ZELEC ECP 3005-XC | DuPont | No core |
| ZELEC ECP 3010-XC | DuPont | No core |

In a second embodiment, an insulative conformal acrylic resin coating 30 may be formulated as detailed in Table III. The associated static dissipative acrylic resin coating 34 may be formulated as detailed in Table IV. These coatings are generally approximately 30–35% solids coatings, meaning that if an initial 5 mil coating is applied, the post-curing thickness will be 1.5 mils (0.3×5 mils). The insulative conformal layer 30 is preferably applied to a uniform 5 mil approximate thickness and then cured for approximately one hour at 23 degrees Celsius (°C.), followed by approximately six hours at 50° C. The static dissipative layer 34 is then preferably applied in the same thickness and cured in the same manner.

TABLE III

| Insulative Acrylic Resin | |
|---|---|
| CONSTITUENT COMPOUND | WEIGHT % |
| Toluene | 52.5 |
| Methyl Ethyl Ketone | 17.5 |
| ELVACITE 2028* | 30.0 |

*Trademark of DuPont Corp. Polymethylmethacrylate Copolymer.

TABLE IV

| Static Dissipative Acrylic Resin | |
|---|---|
| CONSTITUENT COMPOUND | WEIGHT % |
| Toluene | 48.0 |
| Methyl Ethyl Ketone | 16.7 |
| ELVACITE 2028 | 30.0 |
| TROYSOL 98C* | 0.5 |
| ZELEC ECP 1410 | 4.8 |

*Trademark of Troy Chemical. Anti-settling/dispersing aid

In a third embodiment, an insulative conformal epoxy resin coating 30 may be formulated as detailed in Table V. The associated static dissipative epoxy resin coating 34 may be formulated as detailed in Table VI. These coatings are generally 100% active coatings, meaning that if an initial 1.5 mil coating is applied, the post-curing thickness will still be approximately 1.5 mils. The insulative conformal layer 30 is preferably applied to a uniform 1.5–2.0 mil approximate thickness and then cured for approximately two to six hours at 60° C. and approximately 40–60% relative humidity. The static dissipative layer 34 is then preferably applied in the same thickness and cured in the same manner.

TABLE V

| Insulative Epoxy Resin | |
|---|---|
| CONSTITUENT COMPOUND | WEIGHT % |
| CARGILL 1574 Resin* | 100.0 |

*Trademark of Cargill Chemical. Epoxyacrylate resin.

TABLE VI

| Static Dissipative Epoxy Resin | |
|---|---|
| CONSTITUENT COMPOUND | WEIGHT % |
| CARGILL 1574 Resin | 83.0 |
| TROYSOL 98C | 1.0 |
| ZELEC ECP 1410 | 16.0 |

In a fourth embodiment, an insulative conformal silicone resin coating 30 may be formulated as detailed in Table VII. The associated static dissipative silicone resin coating 34 may be formulated as detailed in Table VIII. These coatings are generally approximately 20% solids coatings, meaning that if an initial 5–10 mil coating is applied, the post-curing thickness will be 1–2 mils. The insulative conformal layer 30 is preferably applied to a uniform 5 mil approximate thickness and then cured for approximately two hours at 23°–25° C., followed by approximately 24 hours at 60° C. and a relative humidity of at least 60%. The static dissipative layer 34 is then preferably applied in the same thickness and cured in the same manner.

TABLE VII

| Insulative Silicone Resin | |
|---|---|
| CONSTITUENT COMPOUND | WEIGHT % |
| 1,1,1 Trichloroethane | 50.0 |
| Xylene | 16.7 |
| DOW CORNING 12577* | 33.3 |

*60% solids silicone resin.

TABLE VIII

| Static Dissipative Silicone Resin | |
|---|---|
| CONSTITUENT COMPOUND | WEIGHT % |
| 1,1,1 Trichloroethane | 61.2 |
| DOW CORNING 12577 | 33.0 |
| TROYSOL 98C | 0.5 |
| ZELEC ECP 1410 | 5.3 |

In a fifth embodiment, an insulative conformal urethane resin coating 30 may be formulated as detailed in Table IX. The associated static dissipative urethane resin coating 34 may be formulated as detailed in Table X. These coatings are generally approximately 30–35% solids coatings, meaning that if an initial 5 mil coating is applied, the post-curing thickness will be 1.5 mils (0.3×5 mils). The insulative conformal layer 30 is preferably applied to a uniform 5 mil approximate thickness and then cured for approximately one hour at 23 degrees Celsius (°C.), followed by approximately six hours at 50° C. with a relative humidity of at least 60%. The static dissipative layer 34 is then preferably applied in the same thickness and cured in the same manner.

TABLE IX

| Insulative Urethane Resin | |
|---|---|
| CONSTITUENT COMPOUND | WEIGHT % |
| n-Propyl Propionate | 34.0 |
| MERECO CN-785U Resin* | 66.0 |

*Trademark of Mereco Chemical. 35% solids Urethane Resin.

TABLE IV

| Static Dissipative Urethane Resin | |
|---|---|
| CONSTITUENT COMPOUND | WEIGHT % |
| n-Propyl Propionate | 29.0 |
| MERECO CN-785U Resin | 66.0 |
| TROYSOL 98C | 1.0 |
| ZELEC ECP 1410 | 4.0 |

The present invention provides a further important advantage which is not available in the prior art devices. The Faraday cage formed by conductive conformal layer 34 and ground contact 32 prevents radio frequency (RF) emissions from passing through the layer. Interference from unintended RF emissions are a major problem for electronic equipment such as computers and other consumer electronics. The problem is serious enough that it is now regulated by the Federal Communications Commission (FCC). The present invention shields the circuit board 10 from any outside emissions which may interfere with the circuit operation. This is because no flux lines can penetrate the conductive layer 34 at the RF frequencies, so there can be no induced voltage on any of the components 12. The converse is also true. The conductive conformal coat layer 34 prevents the circuit board 10 from emitting any stray RF radiation which may interfere with the operation of other electronic equipment nearby. Because the prior art ESD protective devices are not used while the circuit board 10 is operational, they are completely ineffective in providing this highly desirable RF emission shielding.

It is an important advantage of the present invention that all of the illustrative embodiments result in insulative and static dissipative coatings which are substantially transparent. Such transparency is important because it enables component part numbers, component color coded values, etc. to be read after the conformal coatings have been applied. This is important for identification of the circuit board 10 not only during the manufacturing process, but also during sales, installation and any later servicing.

Although preferred embodiments of the invention have been described in the foregoing Detailed Description and illustrated in the accompanying drawings, it will be understood that the invention is not limited to the embodiments disclosed, but is capable of numerous rearrangements, modifications, and substitutions of parts and elements without departing from the spirit of the invention. Accordingly, the present invention is intended to encompass such rearrangements, modifications, and substitutions of parts and elements as fall within the scope of the invention.

I claim:

1. A method of coating an electronic device, comprising the steps of:
   (a) applying a non-conductive conformal layer substantially covering said electronic device; and
   (b) applying a conductive conformal layer substantially coveting said non-conductive conformal layer, wherein said conductive conformal layer is formed by addition of a conductive additive to a material of substantially the same composition as a material used to form said non-conductive conformal layer.

2. The method of claim 1 wherein said electronic device includes a circuit board and further including the step of operatively coupling said conductive conformal layer to a ground plane of said circuit board.

3. The method of claim 1 wherein said step (a) comprises applying a material selected from the group consisting of acrylic resins, epoxy resins, silicone resins, urethane resins, and paraxylene.

4. The method of claim 1 wherein said conductive additive is an Antimony doped Tin Oxide.

5. The method of claim 1 wherein said steps (a) and (b) comprise a method selected from the group consisting of dip coating, brush coating, non-aerosol spray coating, and aerosol spray coating.

6. The method of claim 1 wherein said conductive conformal layer has a surface resistivity of less than $10^9$ Ohms/square.

7. A method of grounding an electronic circuit board, comprising the steps of:
   (a) applying a non-conductive conformal layer substantially coveting said electronic circuit board;
   (b) applying a conductive conformal layer substantially coveting said non-conductive conformal layer, wherein said conductive conformal layer is formed by addition of a conductive additive to a material of substantially the same composition as a material used to form said non-conductive conformal layer;
   (c) making electrical contact between said conductive conformal layer and a ground plane of said electronic circuit board; and (d) operatively coupling said ground plane to a ground potential.

8. The method of claim 7 wherein said step (a) comprises applying a material selected from the group consisting of acrylic resins, epoxy resins, silicone resins, urethane resins, and paraxylene.

9. The method of claim 7 wherein said conductive additive is an Antimony doped Tin Oxide.

10. The method of claim 7 wherein said steps (a) and (b) comprise a method selected from the group consisting of dip coating; brush coating, non-aerosol spray coating, and aerosol spray coating.

11. The method of claim 7 wherein said conductive conformal layer has a surface resistivity of less than $10^9$ Ohms/square.

* * * * *